United States Patent [19]

Wakamatsu

[11] Patent Number: 5,545,045
[45] Date of Patent: Aug. 13, 1996

[54] IC CONTACTOR

[75] Inventor: Hideki Wakamatsu, Yokohama, Japan

[73] Assignee: Kabushiki Kaisha Toshiba, Kawasaki, Japan

[21] Appl. No.: 296,914

[22] Filed: Aug. 31, 1994

[30] Foreign Application Priority Data

Sep. 1, 1993 [JP] Japan .................................. 5-217730

[51] Int. Cl.$^6$ ...................................................... H01R 9/09
[52] U.S. Cl. .......................... 439/70; 439/525; 439/526; 439/862
[58] Field of Search ................................ 439/70, 71, 72, 439/73, 525, 526, 862

[56] References Cited

U.S. PATENT DOCUMENTS

| | | | |
|---|---|---|---|
| 4,921,430 | 5/1990 | Matsuoka | 439/72 |
| 4,986,760 | 1/1991 | Petersen et al. | 439/71 |
| 5,018,981 | 5/1991 | Matsuoka | 439/72 |
| 5,427,536 | 6/1995 | Petersen et al. | 439/71 |

*Primary Examiner*—P. Austin Bradley
*Assistant Examiner*—T. C. Patel
*Attorney, Agent, or Firm*—Oblon, Spivak, McClelland, Maier & Neustadt, P.C.

[57] ABSTRACT

An IC contactor including a plurality of contact pins arranged in a line near a periphery of an IC receiving member so as to correspond to a plurality of external lead pins of an IC, mounted on the receiving member. The contact pins include a plurality of first contact pins and a plurality of second contact pins arranged alternately. The first contact pins each have a projecting portion projected in a downward direction, and the second contact pins each have a projecting portion projected in an upward direction. First separators are each interposed between the projecting portions of adjacent first contact pins, and second separators are each interposed between the projecting portions of adjacent second contact pins. Since the directions in which the projection portions of the first and second contact pins are projected are opposite from each other, the separators can be arranged alternately on different lines. Therefore, the contact pins and separators each have a sufficient width, and the width of each contact pin can be made greater than that of each of external lead pins of the semiconductor package.

6 Claims, 5 Drawing Sheets

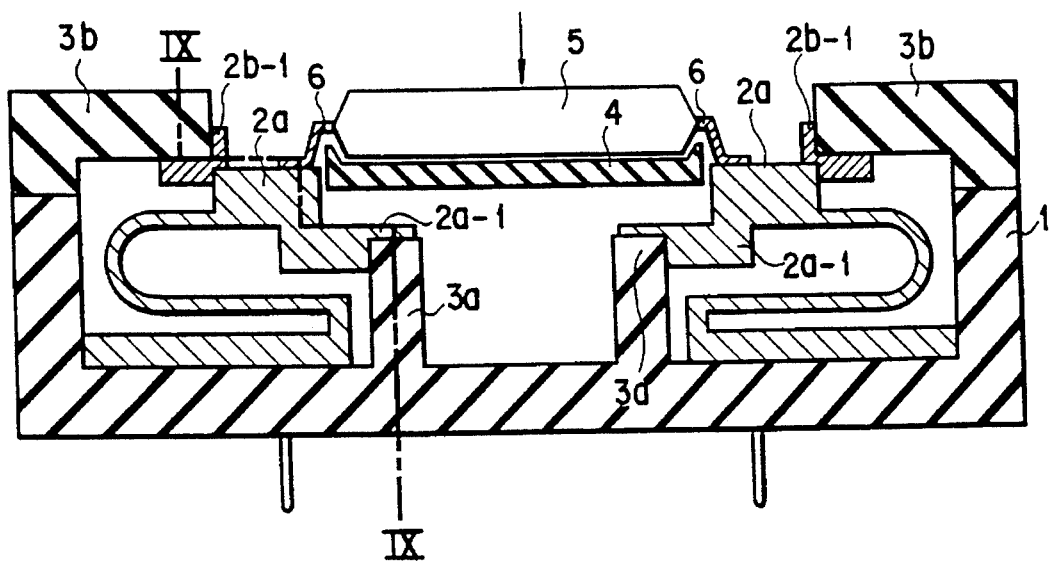
F I G. 5

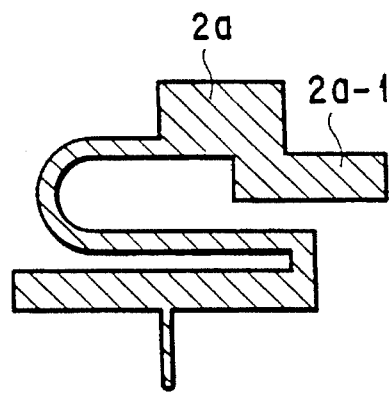
F I G. 6A
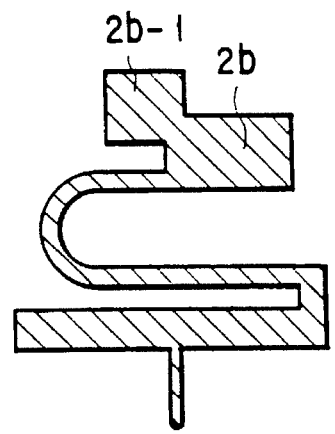
F I G. 6B
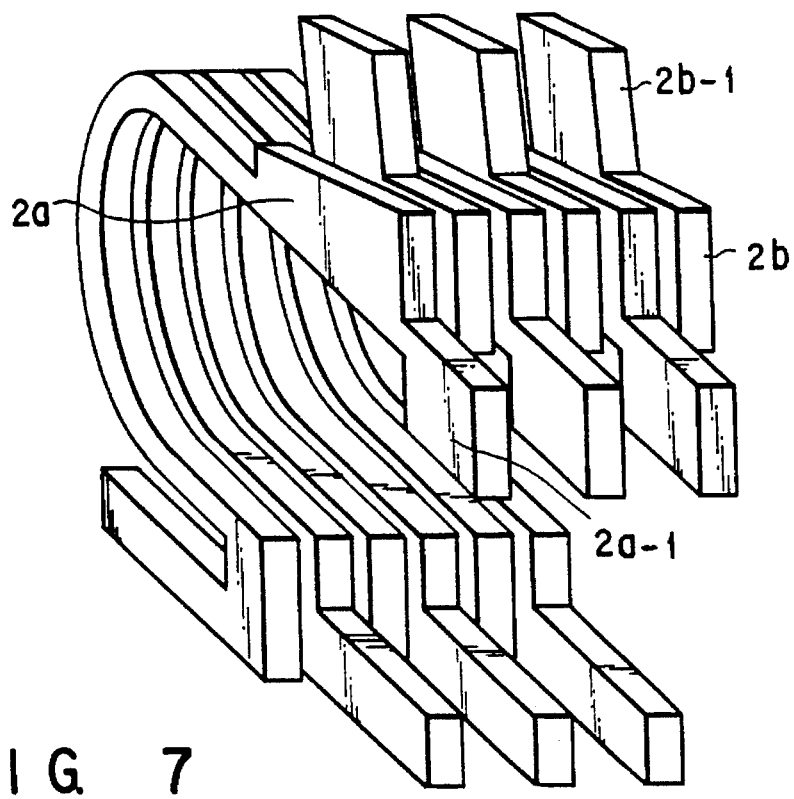
F I G. 7

IC CONTACTOR

BACKGROUND OF THE INVENTION

1. Field of the Invention

The present invention relates to an IC (Integrated Circuit) contactor which is generally called an IC socket and, more specifically, to an IC contactor for use in a socket unit of a burn-in board or an IC test handler.

2. Description of the Related Art

FIG. 1 shows a prior art IC socket (IC contactor). In FIG. 1, reference numeral 1 denotes a body of the IC socket; 4, an IC positioning table; 5, an IC to be tested, fitted into a positioning recess of the table 4; 2, a plurality of contact pins arranged on opposing sides of the table 4 and in a direction perpendicular to FIG. 1; 3, separators each for separating adjacent contact pins 2; and 6, external lead pins (IC leads) extending from opposing sides of the IC 5. The IC 5 is pressed downward (in the direction indicated by the arrow in FIG. 1) by means of a cover member (not shown), so that the lead pins 6 are in contact with their respective contact pins 2, and the contact pins 2 are connected to an IC testing device (not shown).

FIG. 2 is a side view of one of the contact pins 2, FIG. 3 is a perspective view of the contact pins 2 arranged on one side of the IC 5, and FIG. 4 is a cross-sectional view taken along the line IV—IV of FIG. 1.

In the prior art IC socket, as shown in FIG. 1, the IC 5 is positioned by fitting the underside of the IC 5 into the recess of the IC positioning table 4, and the IC 5 is pressed in the direction of the arrow to bring the IC leads 6 into contact with the contact pins 2. By doing so, good contact for measurement of the IC 5 is attained. The contact pins 2 are arranged at regular pitches in the same direction, as illustrated in FIG. 3, and the separators 3 are each inserted between adjacent contact pins 2, as shown in FIG. 4, in order to prevent them from being short-circuited.

In the prior art IC socket described above, a pitch between the IC leads 6 is narrowed in accordance with a great increase in degree of integration of the IC; accordingly, pitches P between the contact pins 2 and between the separators 3 decrease, as shown in FIG. 4. The IC leads 6 tend to curve toward arrows A of FIG. 4 within the allowable range and, in this case, the IC leads 6 shift from the contact pins 2 or drop therefrom, thereby causing a drawback wherein not only normal contact cannot be obtained between the IC leads and contact pints, but also the IC leads may be deformed further.

More specifically, since the width (indicated by R in FIG. 4) of each of the contact pins 2 is gradually reduced in accordance with high degree of integration of the IC, the IC leads 6 drop from the contact pins 2 or, even if not, they are deformed so that only the small portions thereof are located on the contact pins 2. Thus, bad contact occurs in a test for the IC to be tested. If the width of each of the contact pins 2 is increased, the thickness (indicated by S in FIG. 4) of each separator 3 between adjacent contact pins has to be decreased because the pitches of the contact pins are restricted. For this reason, the molding and shaping of the separators 3 are very difficult to execute, and the separators are decreased in mechanical strength and durability.

SUMMARY OF THE INVENTION

The present invention has been developed in consideration of the above situation, and its object is to provide an IC contactor in which external lead pins (IC leads) neither shift nor drop from the contact pins even if the IC leads are arranged at very narrow pitches in a semiconductor package, good contact is reliably obtained between the IC leads and contact pins in a test for the semiconductor package, and separators interposed between the contact pins can easily be manufactured.

To attain the above object, there is provided an IC contactor comprising:

receiving means for receiving an IC to be tested;

a plurality of contact pins arranged near a periphery of the receiving means so as to correspond to a plurality of external lead pins of the IC to be tested, the plurality of contact pins including a plurality of first contact pins and a plurality of second contact pins, the first contact pins and the second contact pins being arranged alternately, the first contact pins each having a projecting portion projected in a direction, and the second contact pins each having a projecting portion projected in an opposite direction;

first separators each interposed between the projecting portions of adjacent first contact pins; and second separators each interposed between the projecting portions of adjacent second contact pins.

According to the IC contactor so formed, since the directions in which the projection portions of the first and second contact pins are projected are opposite from each other, the separators can be arranged alternately on different lines. Therefore, the contact pins and separators each have a sufficient width, and the width of each contact pin can be made greater than that of each of external lead pins of the semiconductor package (the IC contactor body). Even if the external lead pins are arranged at very narrow pitches, electrical contact can reliably be obtained, and the IC leads can be prevented from being deformed. Furthermore, the separators inserted between the contact pins can be formed thickly and produced easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a cross-sectional view showing the constitution of an IC socket according to an embodiment of the present invention;

FIGS. 6A and 6B are side views showing the constitution of contact pins of the IC socket shown in FIG. 5;

FIG. 7 is a perspective view showing the arrangement of contact pins of the IC socket shown in FIG. 5;

DETAILED DESCRIPTION OF THE PREFERRED EMBODIMENT

Figure 1:
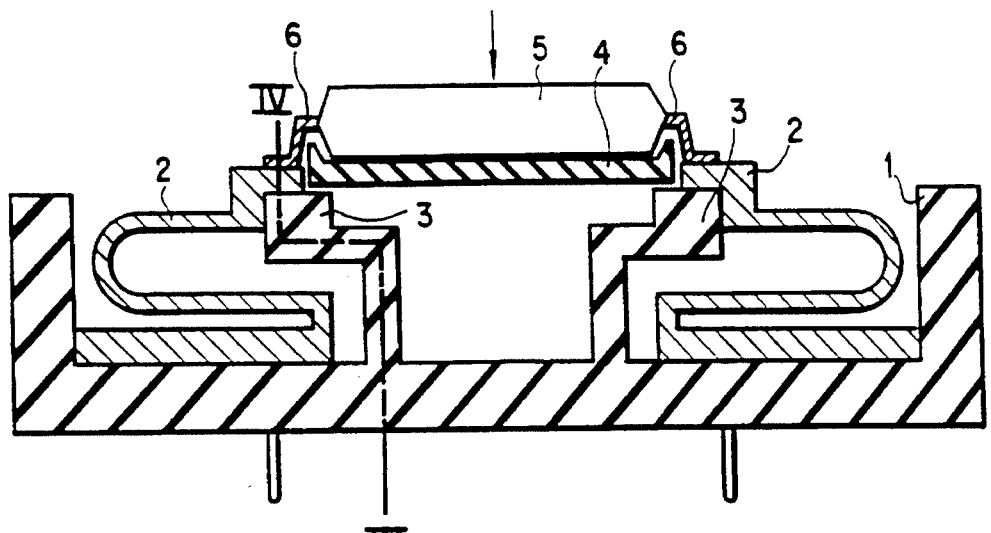
FIG. 1 is a cross-sectional view showing the constitution of a prior art IC socket.
Figure 2:
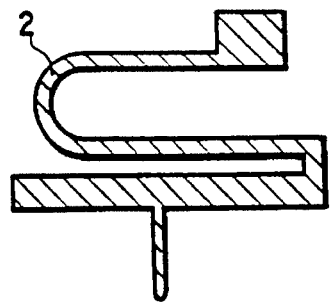
FIG. 2 is a side view showing the constitution of a contact pin of the prior art IC socket shown in FIG. 1.
Figure 3:
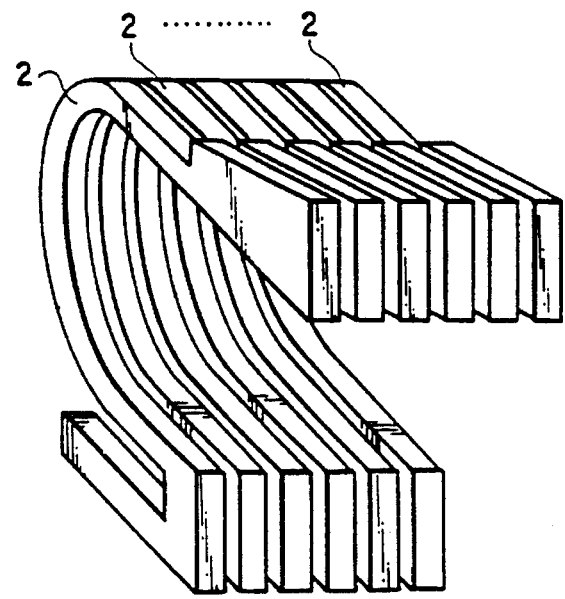
FIG. 3 is a perspective view showing the arrangement of contact pins of the prior art IC socket shown in FIG. 1.
Figure 8:
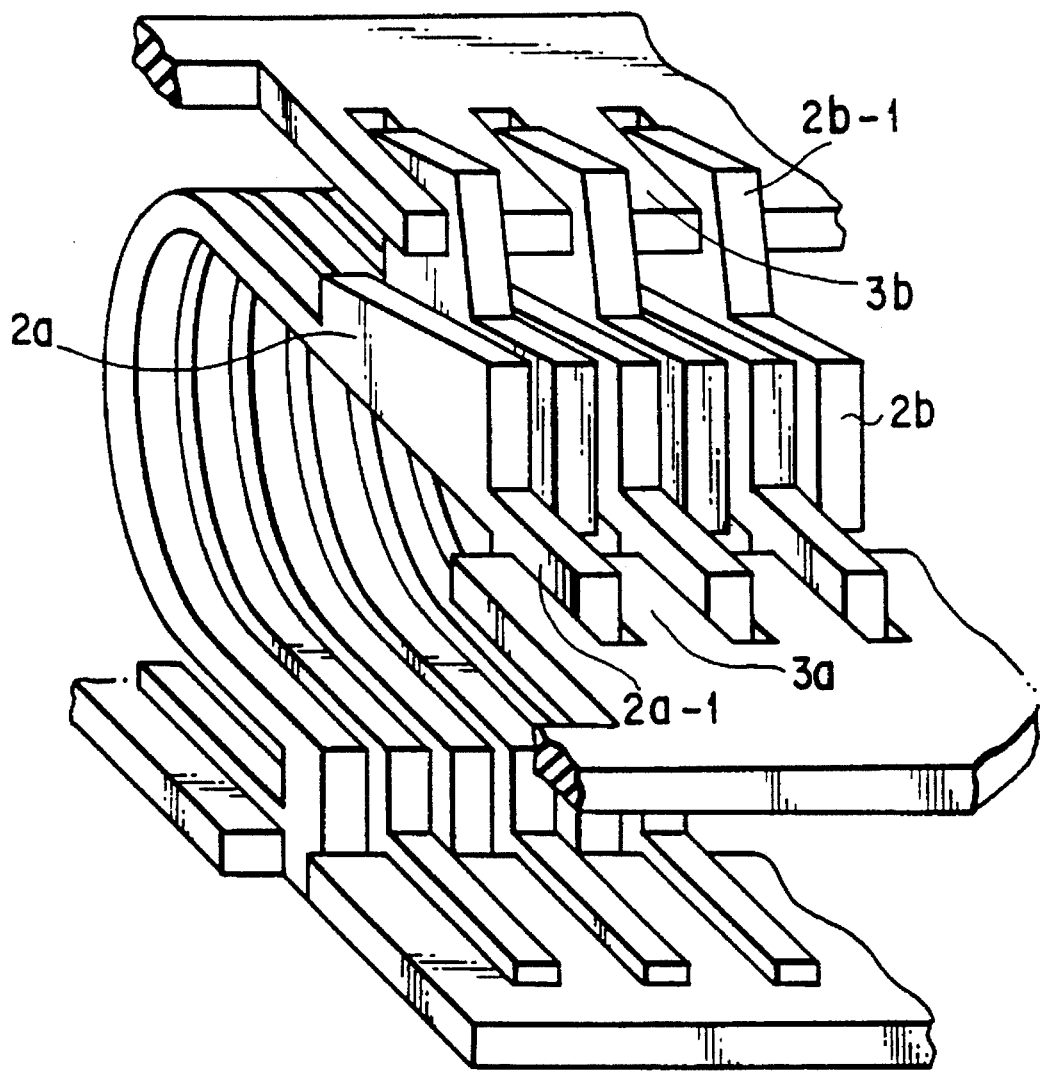
FIG. 8 is a perspective view showing the arrangement of contact pins and separators of the IC socket shown in FIG. 5.
Figure 9:
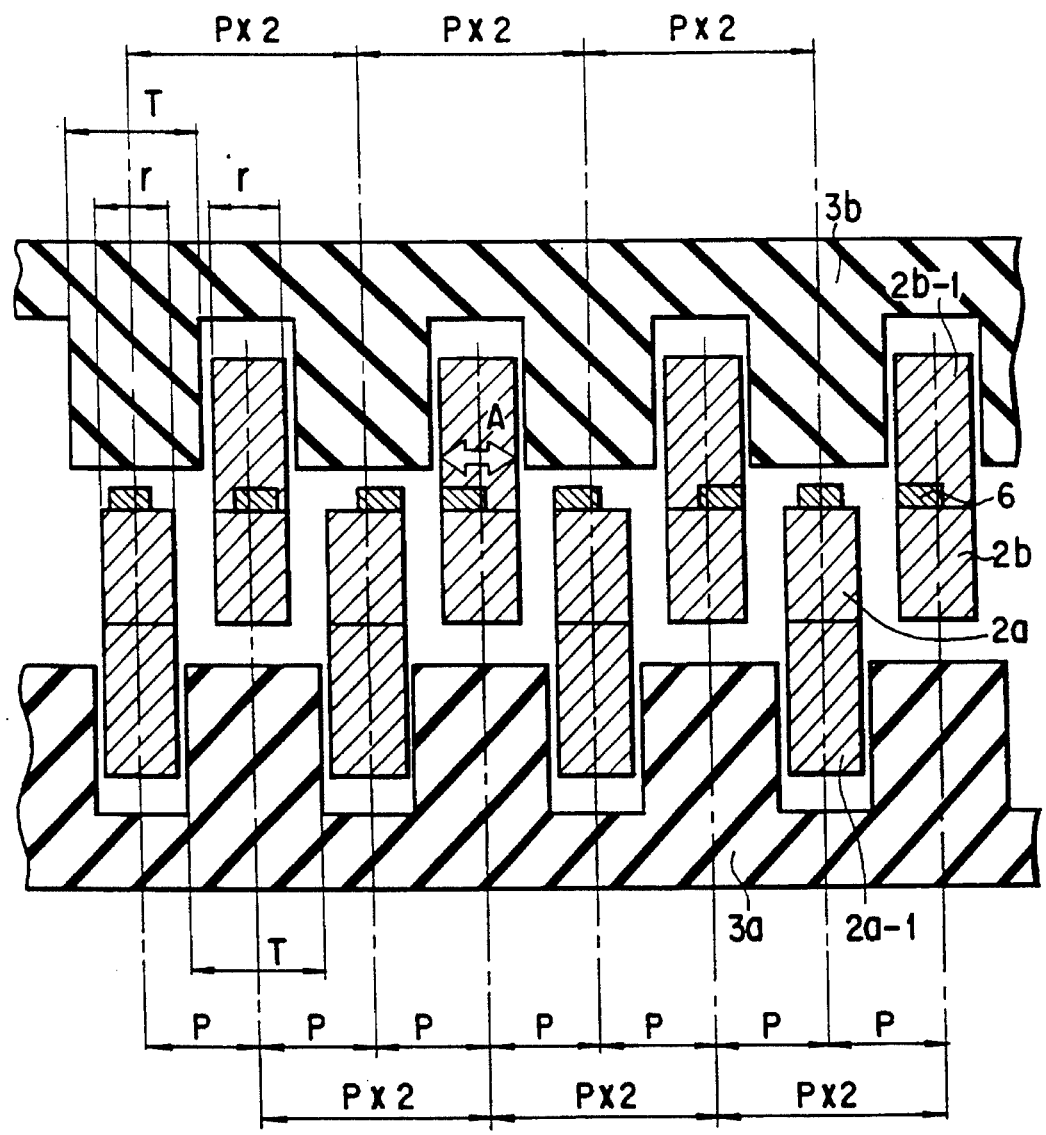
FIG. 9 is a cross-sectional view taken along the line IX—IX of FIG. 5.

An IC socket according to an embodiment of the present invention will now be described, with reference to the accompanying drawings. The IC socket is developed on the basis of the prior art shown in FIG. 1. FIG. 5 shows the constitution of the IC socket of the present invention, and the same components as those in FIG. 1 are denoted by the same reference numerals. FIG. 6A is a side view of one of the contact pins of the IC socket shown in FIG. 5, and FIG. 6B is also a side view of another contact pin. FIG. 7 is a perspective view showing the arrangement of the contact pins of the IC socket of FIG. 5. FIG. 8 is a perspective view of separators arranged between the contact pins shown in FIG. 7. FIG. 9 is a cross-sectional view taken along the line IX—IX of FIG. 5.

The feature of the present invention is as follows.

A plurality of first and second contact pins 2a and 2b are provided near the periphery of a receiving member (positioning table) 4 for an IC 5 to be tested so as to correspond to a plurality of external lead pins 6 of the IC 5. The first and second contact pins 2a and 2b are arranged alternately. While each of the first contact pins 2a has a projecting portion 2a-1 projected downward, and each of the second contact pins 2b has a projecting portion 2b-1 projected upward. Each of first insulative separators 3a is interposed between the projecting portions 2a-1 of adjacent first contact pins 2a, and each of second insulative separators 3b is interposed between the projecting portions 2b-1 of adjacent second contact pins 2b.

In the IC socket (IC contactor) of the embodiment, the contact pins 2a having the projecting portions 2a-1, shown in FIG. 6A, and the contact pins 2b having the projecting portions 2b-1, shown in FIG. 6B, are alternately arranged on the body 1 of the IC socket, as shown in FIG. 7. Furthermore, the positioning table 4 is provided as illustrated in FIG. 5, and so are the separators 3a and 3b for separating the contact pins 2a and 2b, respectively, as illustrated in FIG. 8.

As shown in FIG. 5, a recess for positioning the IC 5 is formed on the upper surface of the positioning table 4, and the contact pins 2a and 2b are arranged around the recess. The contact pins 2a and 2b contact the lead pins 6 of the IC 5, respectively, to form a signal path between the IC 5 and an external IC measurement device. The table 4 is used to set the IC 5 at a predetermined position, on the basis of the positions of the sides of the IC 5, thereby bringing the leads 6 into contact with the contact pins 2a and 2b.

As shown in FIG. 6A, the contact pins 2a are shaped like a bow, and the projecting portion 2a-1 is projected downward from the end of each of the contact pins 2a. The separator 3a is interposed between the projecting portions 2a-1 of adjacent contact pins 2a in order to arrange the contact pins 2a at regular intervals, as shown in FIG. 8. Similarly, as shown in FIG. 6B, the contact pins 2b are shaped like a bow, and the projecting portion 2b-1 is projected upward from the end of each of the contact pins 2b. The separator 3b is interposed between the projecting portions 2b-1 of adjacent contact pins 2b in order to arrange the contact pins 2b at regular intervals. In short, the separators 3a separate the contact pins 2a, while the separators 3b separate the contact pins 2b. The separators 3a are connected to one another at their base portions and formed integrally as one component in the shape of a comb and so are the separators 3b.

According to the above embodiment, as shown in FIG. 9, the pitch P between adjacent contact pins 2a and 2b is narrowed as the pitch between adjacent IC leads 6 is narrowed. However, the pitch between adjacent separators 3a or 3b is represented by P×2, and the width r of each of the contact pins 2a and 2b can be greater than that of each IC lead 6.

Figure 4:
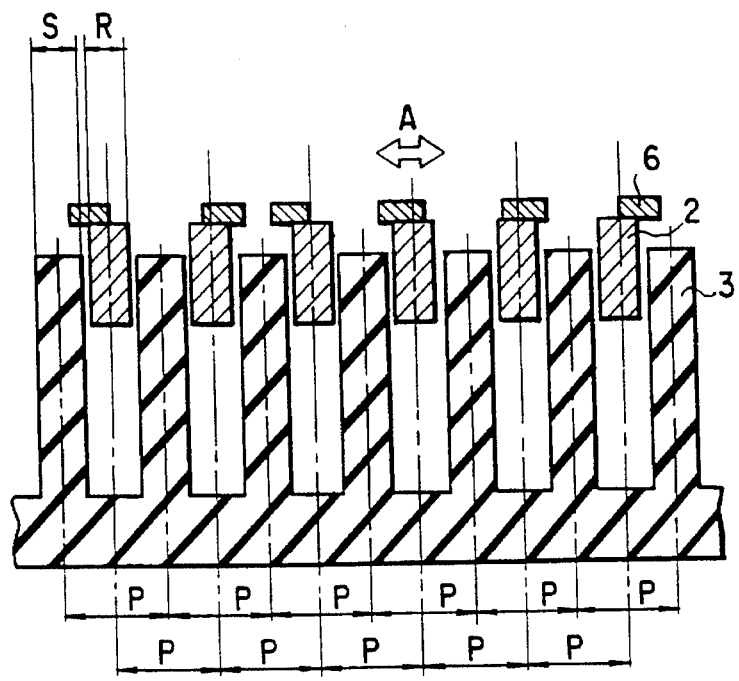
FIG. 4 is a cross-sectional view taken along the line IV—IV of FIG. 1.

In the IC socket having the above-described structure, even though the IC leads 6 are curved in the direction of arrow A within the allowable range, there is a bare possibility that the IC leads 6 will drop out of the contact pins 2a and 2b, with the result that good contact can be attained between the contact pins 2a and 2b and the IC leads 6, and the IC leads can be prevented from being further deformed. Since the width T of each of the separators 3a and 3b (shown in FIG. 9) is about twice as great as that of the separator of the prior art IC socket shown in FIG. 4, the durability of the separators is improved, and the IC socket can be manufactured more easily.

According to the above-described IC socket of the present invention, even though the external lead pins (IC leads) of the semiconductor package (the IC body) are slightly curved, since the contact pins are increased in width, the lead pins are hardly likely to drop from the contact pins, and the lead pins can be prevented from being curved further. It is thus possible to prevent bad contact due to a drop of the lead pins in a test for the IC. Since, moreover, both the contact pins and the separators can be increased in width at the same time, the mold processing and the shaping of these contact pins and separators can be executed considerably more easily, and the durability of the IC contact (socket) can be increased accordingly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An IC contactor comprising:

receiving means for receiving an IC to be tested, said IC to be tested having a plurality of external lead pins arranged in a line;

a plurality of contact pins arranged near a periphery of said receiving means and in a line so as to correspond in position to the plurality of external lead pins arranged in a line of the IC to be tested, said plurality of contact pins including a plurality of first contact pins and a plurality of second contact pins, the first contact pins and the second contact pins being arranged alternately and having respective contacting portions arranged in a line for contacting the external lead pins of the IC to be tested, the first contact pins each having a projecting portion projected from a first portion thereof and the second contact pins each having a projecting portion projected from a second portion of thereof different than the first portion of the first contact pins;

first separators each interposed between the projecting portions of consecutive first contact pins; and second separators each interposed between the projecting portions of consecutive second contact pins.

2. The IC contactor according to claim 1, wherein said first contact pins are shaped like a bow, and said second contact pins are also shaped like a bow.

3. The IC contactor according to claim 1, wherein said first separators are connected to one another at base portions thereof and formed integrally as one component in a shape of a comb, and said second separators are connected to one another at base portions thereof and formed integrally a one component in a shape of a comb.

4. The IC contactor according to claim 1, wherein said first and second contact pins have pitches P therebetween, said first separators have pitches P×2 therebetween, and said second separators have pitches P×2 therebetween.

5. The IC contactor according to claim 1, wherein the projecting portions of said first contact pins are projected in a first direction and the projecting portions of said second contact pins are projected in a second direction different than said first direction.

6. The IC contactor according to claim 5, wherein the projecting portions of the first and second contact pins project in downward and upward directions, respectively.

* * * * *